(12) United States Patent
Moon et al.

(10) Patent No.: US 10,283,593 B2
(45) Date of Patent: May 7, 2019

(54) THIN FILM TRANSISTOR AND METHOD FOR MANUFACTURING THE SAME

(71) Applicant: Jusung Engineering Co., Ltd., Gwangju-si (KR)

(72) Inventors: Jin Wook Moon, Gwangju-si (KR); Yun Hoe Kim, Seoul (KR); Jae Ho Kim, Seoul (KR); Kyu Bum Lee, Gwangju-si (KR); Jae Wan Lee, Gwangju-si (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 0 days.

(21) Appl. No.: 15/652,062

(22) PCT Filed: Feb. 12, 2016

(86) PCT No.: PCT/KR2016/001414
§ 371 (c)(1),
(2) Date: Jul. 17, 2017

(87) PCT Pub. No.: WO2016/129943
PCT Pub. Date: Aug. 18, 2016

(65) Prior Publication Data
US 2018/0033858 A1    Feb. 1, 2018

(30) Foreign Application Priority Data

Feb. 12, 2015 (KR) .................. 10-2015-0021700

(51) Int. Cl.
*H01L 29/10* (2006.01)
*H01L 29/22* (2006.01)
(Continued)

(52) U.S. Cl.
CPC ...... *H01L 29/1054* (2013.01); *H01L 21/0262* (2013.01); *H01L 21/02554* (2013.01);
(Continued)

(58) Field of Classification Search
CPC ............... H01L 29/1054; H01L 29/22; H01L 21/02565; H01L 21/02554; H01L 21/0262;
(Continued)

(56) References Cited

U.S. PATENT DOCUMENTS 8,283,666 B2   10/2012   Kim et al.
8,501,551 B2    8/2013   Kim et al.
(Continued)

FOREIGN PATENT DOCUMENTS

JP        2013041944 A    2/2013
KR   1020090117582 A   11/2009
(Continued)

OTHER PUBLICATIONS

Hu et al. "Atmospheric pressure chemical vapor deposition of gallium doped zinc oxide thin films from diethyl zinc, water, and triethyl gallium", J. Appl. Phys. 72 (11), Dec. 1, 1992.*
(Continued)

*Primary Examiner* — Hoang-Quan T Ho
*Assistant Examiner* — Juanita B Rhodes
(74) *Attorney, Agent, or Firm* — Andrew D. Fortney; Central California IP Group, P.C.

(57) ABSTRACT

Disclosed is a thin film transistor including a gate electrode on a substrate, a gate insulator over the entire surface of the substrate including the gate electrode, a first active layer corresponding to the gate electrode on the gate insulator, a second active layer on or under the first active layer, and a source electrode and a drain electrode spaced apart by a predetermined distance, the source electrode and the drain electrode being connected to the first active layer or the second active layer.

10 Claims, 7 Drawing Sheets

(51) Int. Cl.
    *H01L 29/26*     (2006.01)
    *H01L 29/66*     (2006.01)
    *H01L 29/786*     (2006.01)
    *H01L 21/02*     (2006.01)
    *H01L 21/205*     (2006.01)

(52) U.S. Cl.
    CPC ...... *H01L 21/02565* (2013.01); *H01L 21/205* (2013.01); *H01L 29/22* (2013.01); *H01L 29/26* (2013.01); *H01L 29/66969* (2013.01); *H01L 29/786* (2013.01); *H01L 29/7869* (2013.01)

(58) Field of Classification Search
    CPC ................. H01L 29/26; H01L 29/7869; H01L 29/66969; H01L 21/205; H01L 29/786
    See application file for complete search history.

(56) References Cited

U.S. PATENT DOCUMENTS

| | | | |
|---|---|---|---|
| 9,093,542 | B2 | 7/2015 | Maeda et al. |
| 9,379,248 | B2 | 6/2016 | Maeda et al. |
| 2009/0166641 | A1* | 7/2009 | Jeong .................. H01L 29/7869 257/72 |
| 2010/0051933 | A1 | 3/2010 | Kim et al. |
| 2013/0005082 | A1 | 1/2013 | Kim et al. |
| 2013/0200361 | A1* | 8/2013 | Tsang .................. H01L 29/7869 257/43 |
| 2013/0221343 | A1* | 8/2013 | Son .................. H01L 29/78618 257/43 |
| 2014/0054588 | A1 | 2/2014 | Maeda et al. |
| 2014/0319512 | A1 | 10/2014 | Maeda et al. |

FOREIGN PATENT DOCUMENTS

| | | |
|---|---|---|
| KR | 20100007703 A | 1/2010 |
| KR | 20100027377 A | 3/2010 |
| KR | 20120077288 A | 7/2012 |
| KR | 1020120077288 A | 7/2012 |
| KR | 1020130056686 A | 5/2013 |
| KR | 20130093922 A | 8/2013 |
| KR | 1020130093922 A | 8/2013 |
| KR | 20130137025 A | 12/2013 |
| KR | 101451926 B1 | 10/2014 |
| KR | 1020140129618 A | 11/2014 |

OTHER PUBLICATIONS

Office Action dated Oct. 5, 2018 for Korean Patent Application 10-2018-0078551; 18 pages; Korean Intellectual Property Office, Republic of Korea.

Sang Yeol Lee et al.; Thin Film Transistor; Abstract of KR20090117582 (A); May 9, 2009; http://kpa.kipris.or.kr.

Jong Uk Bae et al.; Oxide Thin Film Transistor and Method for Fabricating the Same; Bibliographic Data of KR20140129618 (A); Nov. 7, 2014; http://worldwide.espacenet.com.

Jae Ho Kim; "Thin Film Transistor and Method of Manufacturing the Same"; Bibliographic Data of KR10-2013-0056686; May 30, 2013; http://worldwide.espacenet.com.

Jae Hyun Kim; "Thin Film Transistor Using Liquid-Phase Process and Method for Fabricating the Same"; Bibliographic Data of KR10-2013-0093922; Aug. 23, 2013; http://worldwide.espacenet.com.

Jae Hyun Kim; "Thin Film Transistor and Method of Manufacturing the Same"; Bibliographic Data of KR10-2012-0077288; Jul. 10, 2012; http://worldwide.espacenet.com.

Young-Hoon Kim; "Trend of Oxide Transistor Technology"; 7 pages; News & Information for Chemical Engineers; vol. 33, No. 4; 2015.

Notice of Allowance dated Apr. 9, 2018 for Korean Patent Application No. 10-2015-0021700; 5 pages; Korean Intellectual Property Office, Republic of Korea.

Office Action dated Jun. 9, 2017; Korean Patent Application No. 10-2015-0021700; 5 pgs.; Korean Intellectual Property Office, Republic of Korea.

Sun Il Kim et al; "Channel Layer and Transistor Comprising the Same"; Bibliographic Data of KR20100007703 (A); Jan. 22, 2010; http://worldwide.espacenet.com.

Do Hyun Kim et al; "Thin Film Transistor Array Substrate and Method of Fabricating the Same"; Bibliographic Data of KR20100027377 (A); Mar. 11, 2010; http://worldwide.espacenet.com.

Jae Ho Kim et al; "Thin Film Transistor and Method of Manufacturing the Same"; Bibliographic Data of KR20120077288 (A); Jul. 10, 2012; http://worldwide.espacenet.com.

Masashi Ono et al; "Thin Film Transistor, Manufacturing Method of the Same, Display Device, Image Sensor, X-Ray Sensor and X-Ray Digital Imaging Equipment"; Bibliographic Data of JP2013041944 (A); Feb. 28, 2013; http://worldwide.espacenet.com.

Hyun Jae Kim et al; "Thin Film Transistor Using Liquid-Phase Process and Method for Fabricating the Same"; Bibliographic Data of KR20130093922 (A); Aug. 23, 2013; http://worldwide.espacenet.com.

Takeaki Maeda et al; "Thin Film Transistor Structure, and Thin Film Transistor and Display Device Provided with Said Structure"; Bibliographic Data of KR20130137025 (A); Dec. 13, 2013; http://worldwide.espacenet.com.

Hyun Jae Kim et al; "Electronic Device and Method for Manufacturing the Same, and Method for Manufacturing Thin Film Transistor"; Bibliographic Data of KR101451926 (B1); Oct. 23, 2014; http://worldwide.espacenet.com.

* cited by examiner

[FIG. 1]
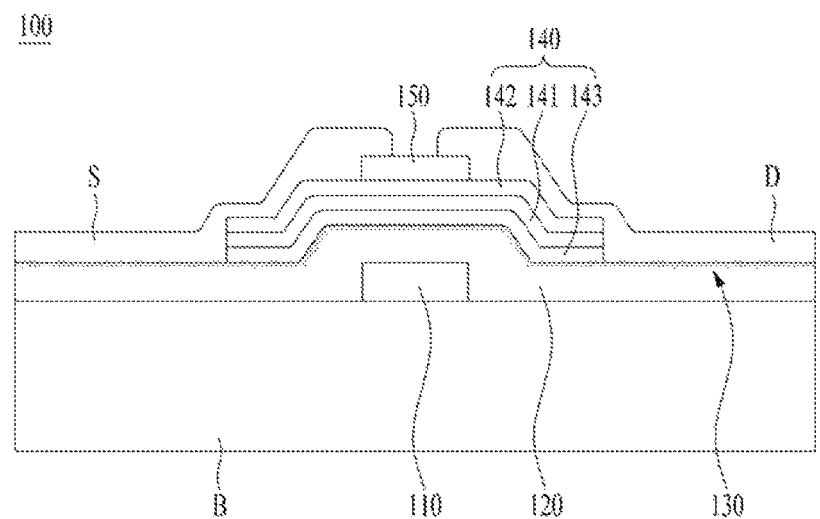
[FIG. 2]
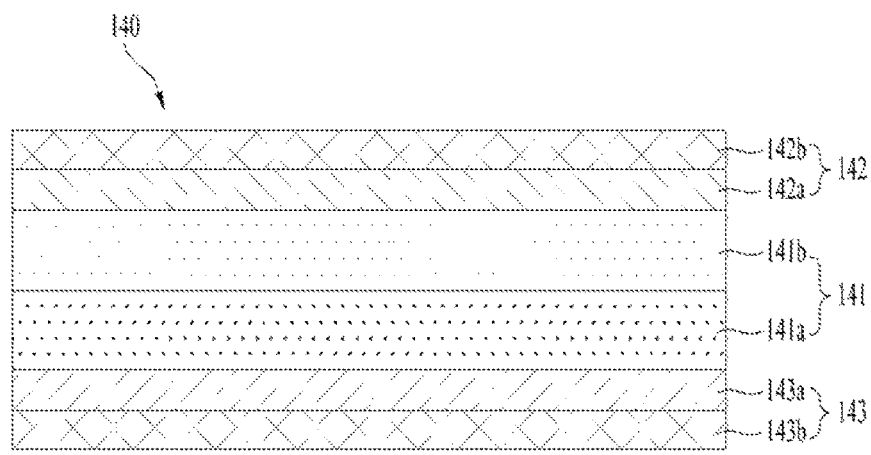

【FIG. 3】
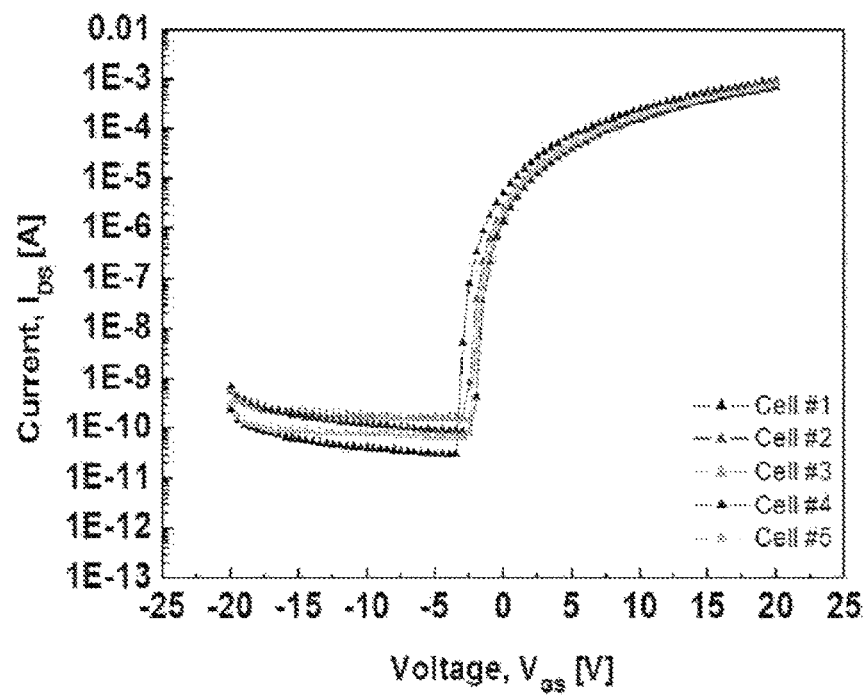
【FIG. 4】
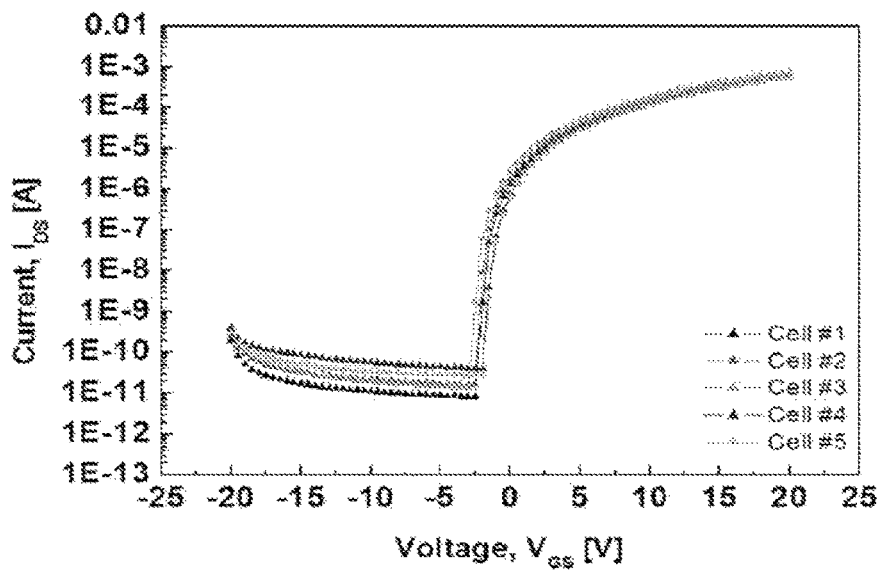

【FIG. 5】
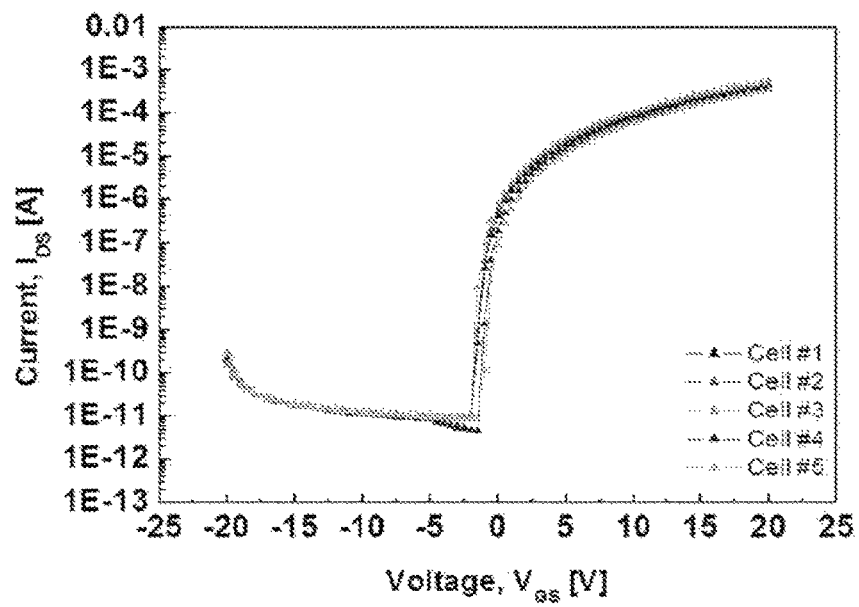
【FIG. 6】
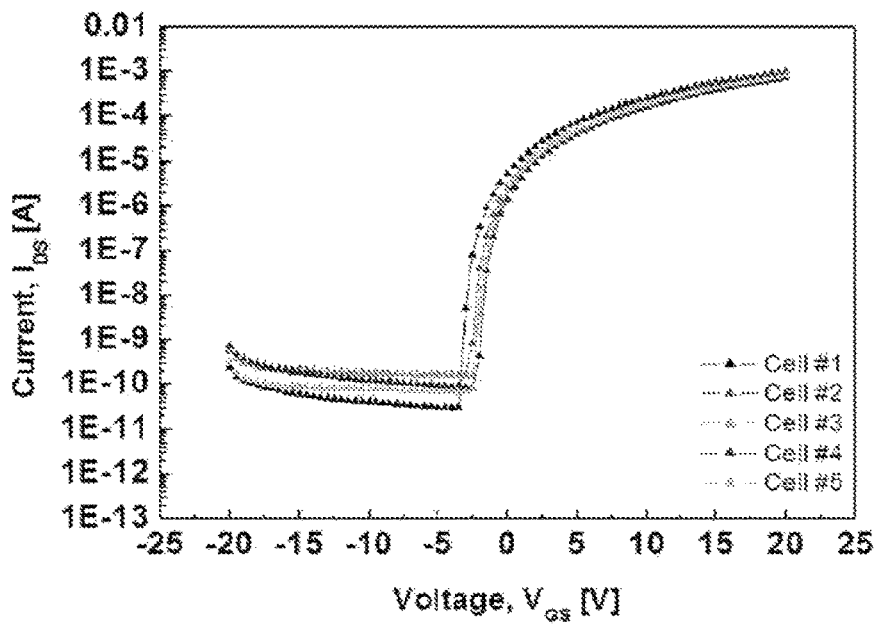

【FIG. 7】
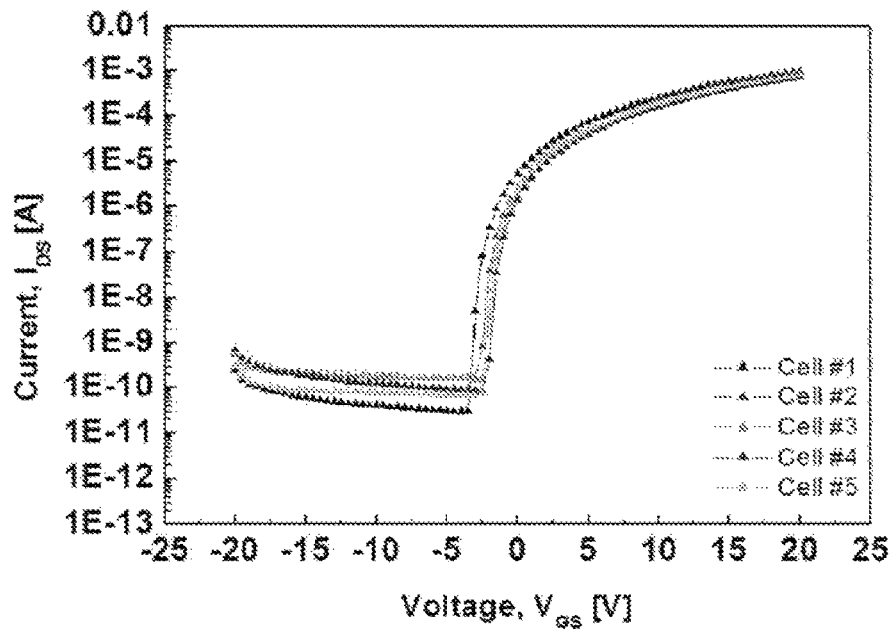
【FIG. 8】
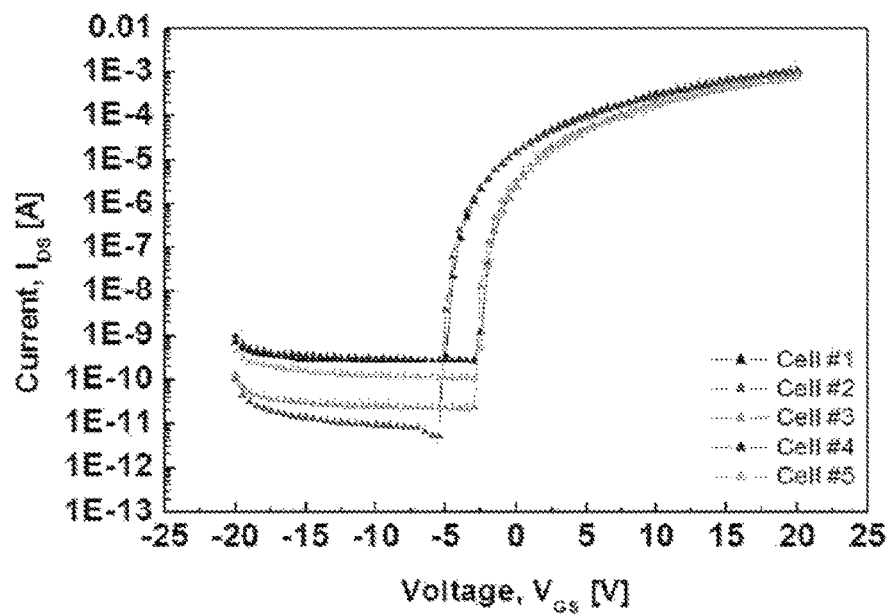

【FIG. 9】
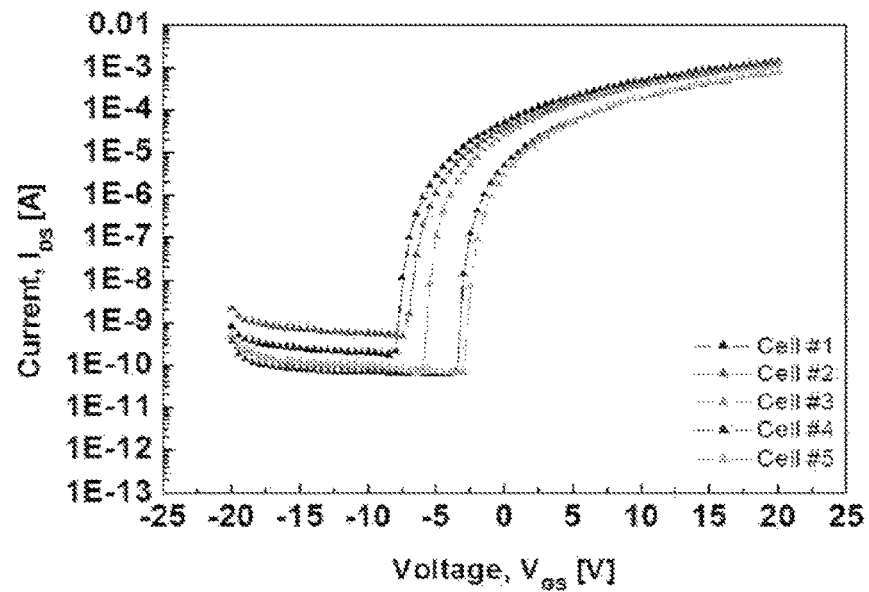
【FIG. 10】
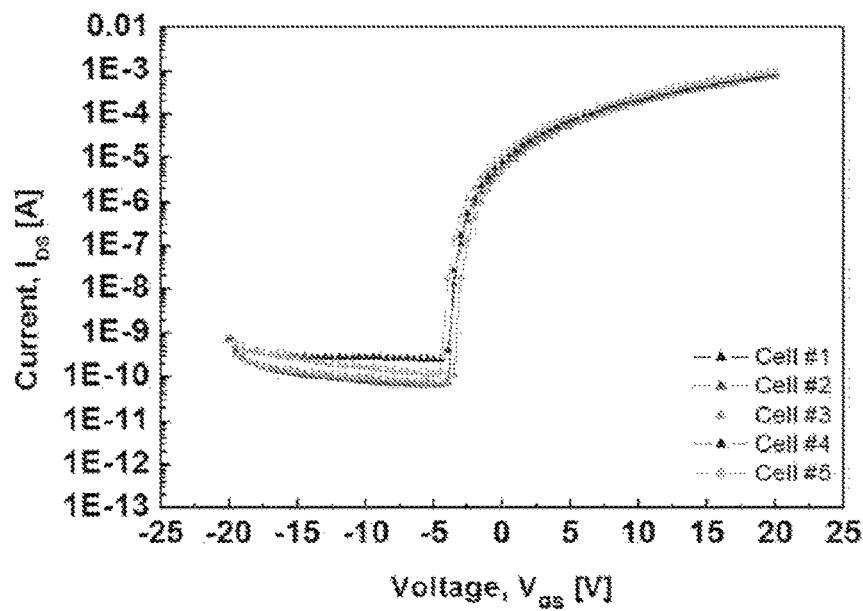

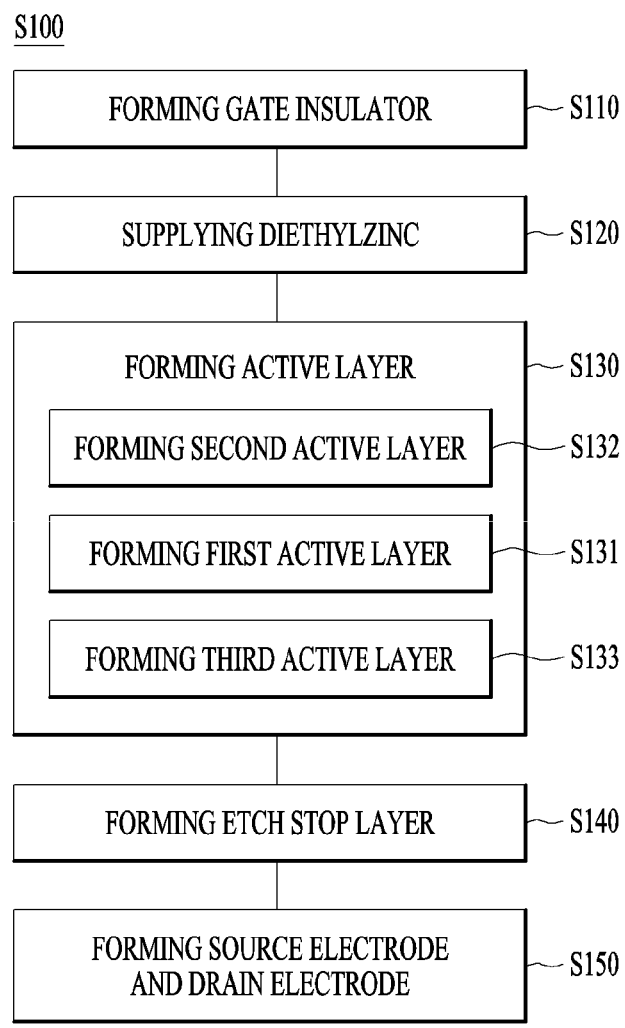
[FIG. 11]

[FIG. 12]
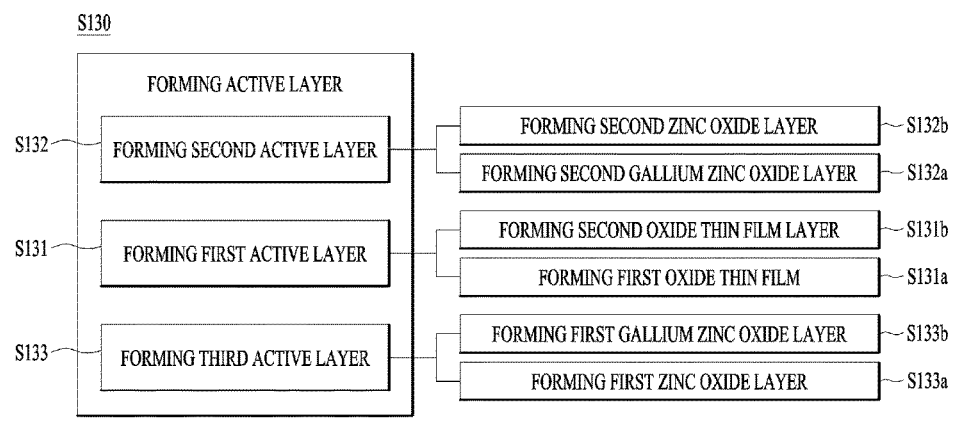

THIN FILM TRANSISTOR AND METHOD FOR MANUFACTURING THE SAME

TECHNICAL FIELD

The present invention relates to a thin film transistor and a method for manufacturing the same, and more particularly, to a thin film transistor and a method for manufacturing the same capable of securing stable device properties of oxide transistors.

BACKGROUND ART

In general, thin film transistors (TFTs) are used as circuits for independently driving respective pixels in liquid crystal displays (LCDs), organic electroluminescent (EL) displays and the like. Such a thin film transistor is formed together with gate lines and data lines on a lower substrate of a display device. That is, the thin film transistor includes a gate electrode which is a part of the gate line, an active layer used as a channel, a source electrode and a drain electrode which are parts of the data line, a gate insulator and the like.

The active layer of the thin film transistor is formed using amorphous silicon or crystalline silicon. However, a thin film transistor substrate using silicon has a drawback of unsuitability for use in flexible display devices due to great weight and inflexibility because it should use a glass substrate. To solve this drawback, recently, a great deal of research has been made on metal oxides.

In addition, research is underway on thin films of zinc oxide (ZnO) as metal oxide used for the active layer of thin film transistors. ZnO thin films are characterized in that crystals are readily grown even at low temperatures and are known as materials for efficiently securing high charge concentration and mobility. However, ZnO thin films are stable upon exposure to air, thus disadvantageously causing deterioration of stability of thin film transistors. In addition, excess carriers generated by oxygen defects may cause problems of increase in off current and variation in threshold voltage.

To improve qualities of ZnO thin films, indium-gallium-zinc oxide (hereinafter, referred to as "IGZO") thin films in which ZnO thin films are doped with indium (In) and gallium (Ga) have been suggested.

However, when IGZO thin films are deposited using sputters, since deposition is performed using a single target of indium-gallium-zinc with a constant composition, control of a source composition is disadvantageously difficult. In addition, in this case, device properties such as threshold voltage and mobility are disadvantageously deteriorated.

DISCLOSURE

Technical Problem

An object of the present invention is to provide a thin film transistor that is capable of improving interfacial properties between the gate insulator and the active layer, or between the active layer and the etch stop layer, of oxide transistor formed by IGZO MOCVD.

Technical Solution

The object of the present invention can be achieved by providing a thin film transistor including a gate electrode formed on a substrate, a gate insulator formed over the entire surface of the substrate including the gate electrode, a first active layer formed to correspond to the gate electrode on the gate insulator, a second active layer formed on or under the first active layer, and a source electrode and a drain electrode spaced apart by a predetermined distance, the source electrode and the drain electrode being connected to the first active layer or the second active layer.

The thin film transistor may further include a third active layer formed on or under the first active layer such that the third active layer faces the second active layer based on the first active layer.

The first active layer may include a first oxide thin film layer formed by atomic layer deposition (ALD), and a second oxide thin film layer formed by chemical vapor deposition (CVD).

The first oxide thin film layer may be disposed closer to the gate insulator than the second oxide thin film layer.

The second active layer and the third active layer may include at least one of a zinc oxide (ZnO) layer and a gallium zinc oxide (GZO) layer.

When the second active layer or the third active layer includes a plurality of layers of the zinc oxide layer and the gallium zinc oxide layer, the gallium zinc oxide layer may be disposed adjacent to the first active layer.

The thin film transistor may further include an etch stop layer between an upper surface of the first active layer, or the second active layer or third active layer disposed on the first active layer, and a lower surface of the source electrode and the drain electrode.

In another aspect of the present invention, a method for manufacturing a thin film transistor includes forming a gate electrode on a substrate and forming a gate insulator on the gate electrode, forming an active layer including forming a third active layer on the gate insulator, forming a first active layer on the third active layer and forming a second active layer on the first active layer, forming an etch stop layer over the entire surface of the substrate including the first active layer to the third active layer, and forming a source electrode and a drain electrode spaced apart from each other by a predetermined distance on the etch stop layer such that the source electrode and the drain electrode are connected to the active layer.

The forming the third active layer may include forming a first zinc oxide layer on the gate insulator, and forming a first gallium zinc oxide layer on the first zinc oxide layer.

The forming the first active layer may include forming a first oxide thin film layer on the first gallium zinc oxide layer by atomic layer deposition, and forming a second oxide thin film layer on the first oxide thin film layer by chemical vapor deposition.

The forming the second active layer may include forming a second gallium zinc oxide layer on the second oxide thin film layer, and forming a second zinc oxide layer on the second gallium zinc oxide layer.

Advantageous Effects

The thin film transistor and method for manufacturing the same according to the present invention have the following effects.

First, the active layer is formed with the first active layer to the third active layer, thereby improving interfacial properties.

Second, more specifically, the second active layer corresponding to the back channel is formed as ZnO and GZO thin films, thereby improving on current and device mobility.

Third, the third active layer corresponding to the front channel is also formed as ZnO and GZO thin films, thereby manufacturing devices with improved device distribution, stable threshold voltage, current and mobility.

Fourth, in conclusion, by control of the composition of sources for forming the first active layer to the third active layer and thicknesses of the layers, current levels, interfacial property between the gate insulator and the active layer, or the active layer and the etch stop layer can be improved and device properties such as threshold voltage and mobility can be improved.

DESCRIPTION OF DRAWINGS

FIG. 1 is a sectional view illustrating a thin film transistor according to the present invention.

FIG. 2 is a reference view illustrating the active layer of the thin film transistor shown in FIG. 1.

FIGS. 3 to 6 are graphs showing test results for the second active layer of the thin film transistor shown in FIG. 2.

FIGS. 7 to 10 are graphs showing test results for the third active layer of the thin film transistor shown in FIG. 2.

FIGS. 11 and 12 are flowcharts illustrating a method for manufacturing a thin film transistor according to the present invention.

BEST MODE

Hereinafter, the preferred embodiments of the present invention will be described in detail with reference to the accompanying drawings such that those having a common knowledge in the art can easily carry out the same. Wherever possible, the same reference numbers will be used throughout the drawings to refer to the same or like parts. Moreover, detailed descriptions related to well-known functions or configurations will be ruled out in order not to unnecessarily obscure subject matters of the present invention. In the drawings, elements of the present invention are enlarged, reduced or simplified for better understanding of the present invention, and drawings and elements thereof are not necessarily given in an appropriate ratio. However, these details will be apparent to those skilled in the art.

FIG. 1 is a sectional view illustrating a thin film transistor 100 according to the present invention.

Referring to FIG. 1, the thin film transistor 100 according to the present invention includes a gate electrode 110 formed on a substrate B, a gate insulator 120 formed on the gate electrode 110, a first active layer 141 formed on the gate insulator 120, a second active layer 142 formed on or under the first active layer 141, a third active layer 143 formed on or under the first active layer 141 so as to face the second active layer 142, based on the first active layer 141, and a source electrode S and a drain electrode D spaced by a predetermined distance on the active layer 140 provided with the first active layer to the third active layer.

The substrate B may be a transparent substrate. For example, a plastic substrate such as a PE, PES, PET or PEN substrate may be used when a silicon substrate, a glass substrate or a flexible display is realized.

In addition, the substrate B may be a reflective substrate. For example, the metal substrate may be used. The metal substrate may be formed using stainless steel, titanium (Ti), molybdenum (Mo) or an alloy thereof. In addition, when the metal substrate is used as the substrate, an additional insulator is preferably formed on the metal substrate. This serves to prevent short-circuit between the metal substrate and the gate electrode 110 and diffusion of metal atoms from the metal substrate.

The insulator may be formed using at least one of silicon oxide ($SiO_2$), silicon nitride (SiN), alumina ($Al_2O_3$) and a combination thereof. In addition, a diffusion stop layer may be formed under the insulator using an inorganic material including at least one of titanium nitride (TiN), titanium aluminum nitride (TiAlN), silicon carbide (SiC) and a compound thereof.

In addition, the gate electrode 110 is formed using a conductive material, for example, an alloy including one or more selected from the group consisting of aluminum (Al), neodymium (Nd), silver (Ag), chromium (Cr), titanium (Ti), tantalum (Ta), molybdenum (Mo) and copper (Cu).

In addition, the gate electrode 110 may have a monolayer structure or a multilayer structure including a plurality of metal layers. That is, the gate electrode 110 may be formed into a multiple layer structure including one or more metal layers, such as chrome (Cr), titanium (Ti), tantalum (Ta) or molybdenum (Mo), with superior physical and chemical properties and one or more metal layers, such as aluminum (Al), silver (Ag) or copper (Cu), with low specific resistance.

In addition, the gate insulator 120 is formed on the gate electrode 110. The gate insulator 120 may be formed on the substrate including upper and side surfaces of the gate electrode 110. In addition, the gate insulator 120 may be formed in the form of a single or multiple layers using one or more insulating materials of inorganic insulators including silicon oxide ($SiO_2$), silicon nitride (SiN), alumina ($Al_2O_3$), and zirconia ($ZrO_2$) with excellent adhesion to metal materials and insulation voltage. The multiple layers of the gate insulator 120 may be for example formed by depositing silicon nitride and silicon oxide. In this case, silicon nitride may be previously formed on the gate electrode 110 to prevent oxidation of the gate electrode upon deposition of silicon oxide.

The plurality of active layers 140 is formed on the gate insulator 120 using indium-gallium-zinc oxide (IGZO). The active layer 140 includes the first active layer 141 to the third active layer 143, the second active layer 142 corresponding to a back channel is formed on the first active layer 141, and the third active layer 143 corresponding to a front channel is formed under the first active layer 141.

The first active layer 141 includes a first oxide thin film layer 141a and a second oxide thin film layer 141b.

The first oxide thin film layer 141a is formed by atomic layer deposition (ALD). In addition, the second oxide thin film layer 141b is formed by chemical deposition such as chemical vapor deposition (CVD).

The IGZO thin film is formed using an indium source, a gallium source, a zinc source and an oxide source. For example, the indium source may be trimethyl indium (In($CH_3$)3) (TMIn), the gallium source may be trimethyl gallium (Ga($CH_3$)3) (TMGa), and the zinc source may be diethyl zinc ($Zn(C_2H_5)_2$) (DEZ), or dimethyl zinc ($Zn(CH_3)_2$) (DMZ). In addition, the oxide source may include an oxygen-containing material, for example, at least one of oxygen ($O_2$), ozone ($O_3$) water ($H_2O$), $N_2O$, and $CO_2$.

The third active layer 143 corresponds to the front channel and includes a gallium zinc oxide layer (GZO) 143a and a zinc oxide layer (ZnO) 143b.

Before formation of the zinc oxide layer 143b, a process of supplying diethyl zinc (DEZ) 130 onto the gate insulator (DEZ pre-flowing, S120) is performed. When the diethyl zinc 130 is supplied, effects of easy deposition of the zinc oxide layer 143b and source stabilization can be obtained.

In addition, after formation of the zinc oxide thin film, the gallium zinc oxide layer is formed on the zinc oxide thin film.

In addition, the second active layer 142 corresponding to the back channel is disposed on the first active layer, and the second active layer 142 includes a gallium zinc oxide layer (GZO) 142a and a zinc oxide layer (ZnO) 142b, like the third active layer 143.

In this case, the second active layer 142 is formed by first forming the gallium zinc oxide layer 142a on the first active layer 141 and then forming the zinc oxide layer 142b on the gallium zinc oxide layer 142a.

Accordingly, zinc oxide layers 142b and 143b are disposed on and under the first active layer 141, respectively.

In the embodiment of the present invention, most preferably, each of the second active layer 142 and the third active layer 143 respectively disposed on and under the first active layer 141 includes the gallium zinc oxide layers 142a and 143a, and the zinc oxide layers 142b and 143b, the second active layer 142 and the third active layer 143 may be optionally provided, and the gallium zinc oxide layers 142a and 143a, and the zinc oxide layers 142b and 143b may be also optionally provided.

Although not shown, a part of the upper surface of the second active layer 142 may be treated with plasma. Upon the plasma treatment, the plasma may be formed to a predetermined depth on the upper surface of the second active layer 142 and is used for curing variation in threshold voltage upon formation of the etch stop layer.

The etch stop layer 150 may be formed by PECVD. Plasma may cause damage to the second active layer 142, thus causing the threshold voltage of the thin film transistor to shift in a negative direction and increasing off current. However, by treating the second active layer 142 with plasma before formation of the etch stop layer 150, threshold voltage of the thin film transistor can be shifted in a positive direction. Accordingly, upon the subsequent formation of the etch stop layer 150, the threshold voltage is shifted in the negative direction, thereby curing variation in threshold voltage.

Such plasma treatment may be performed using oxygen plasma by changing treatment conditions depending on conditions such as size of substrate, thickness of active layer and thickness of etch stop layer, and conditions such as temperature, pressure, time and plasma power.

The etch stop layer 150 is formed on the second active layer 142 before formation of the source electrode S and the drain electrode D.

The etch stop layer 150 is formed as a protective layer and thus functions to prevent the source electrode S and the drain electrode D from causing damage to the entirety or part of the second active layer 142.

When the second active layer 142 is not optionally formed, the etch stop layer 150 may also be formed on the first active layer 141 and should be formed before formation of the source electrode S and the drain electrode D.

As such, when the active layer 140 is formed with a plurality of layers, that is, the first active layer 141 to the third active layer 143, in the oxide TFT structure using IGZO MOCVD, effects of improving interfacial properties between the gate insulator 120 and the active layer 140, and the interfacial properties between the active layer 140 and the etch stop layer 150 can be obtained.

In addition, the effect of realizing stable devices can also be obtained by controlling the composition of the active layer 140 or thicknesses of upper and lower layers thereof.

FIGS. 3 to 6 are graphs showing test results for the second active layer 142 of the thin film transistor shown in FIG. 2.

FIGS. 3 to 6 show interfacial property values with respect to the second active layer 142 corresponding to the back channel depending on presence or absence of the gallium zinc oxide layer 142a and the zinc oxide layer 142b.

First, FIG. 3 shows interfacial properties in a case in which both the gallium zinc oxide layer 142a and the zinc oxide layer 142b are formed. In this case, the lowest threshold voltage and the highest mobility are observed.

Next, FIG. 4 shows interfacial properties in a case in which the gallium zinc oxide layer 142a is not formed, whereas only the zinc oxide layer 142b is formed. In this case, as compared to FIG. 3, threshold voltage is slightly increased and mobility is also thus deteriorated.

FIG. 5 shows interfacial properties in a case in which the gallium zinc oxide layer 142a is formed, whereas the zinc oxide layer 142b is not formed. The threshold voltage shown in FIG. 5 is greatly increased and mobility is also greatly deteriorated with a high gradient, as compared to FIG. 3.

Finally, FIG. 6 shows interfacial properties in a case in which neither the gallium zinc oxide layer 142a nor the zinc oxide layer 142b is formed. This shows interfacial properties in a case in which the second active layer 142 is absent, indicating that threshold voltage is considerably increased and mobility is greatly deteriorated, as compared to the previous case.

The following Table 1 compares values of on/off current, sub-threshold slope (S.S), threshold voltage (Vth), and mobility shown in FIGS. 3 to 6.

TABLE 1

|  | On current | Off current | s.s | Threshold voltage | Mobility |
| --- | --- | --- | --- | --- | --- |
| FIG. 3 | 7.96E−04 | 1.00E−10 | 0.35 | 0.81 | 48.38 |
| FIG. 4 | 6.11E−04 | 2.14E−11 | 0.28 | 1.33 | 44.11 |
| FIG. 5 | 4.45E−04 | 7.54E−12 | 0.28 | 2.71 | 37.19 |
| FIG. 6 | 3.28E−04 | 9.35E−12 | 0.27 | 3.42 | 29.76 |

As a result of analysis of interfacial properties of the second active layer 142 depending on presence or absence of the gallium zinc oxide layer 142a and the zinc oxide layer 142b, in the case in which both the gallium zinc oxide layer 342a and the zinc oxide layer 142b are formed, increase in current and improvement in threshold voltage and mobility can be seen, as compared to the case in which one of the gallium zinc oxide layer 142a and the zinc oxide layer 142b is formed.

On the other hand, in the case in which neither the gallium zinc oxide layer 142a nor the zinc oxide layer 142b is formed, the most deteriorated interfacial properties can be seen due to deterioration in current, threshold voltage and mobility, as compared to the case in which one of the gallium zinc oxide layer 142a and the zinc oxide layer 142b is formed.

Accordingly, it can be seen that current levels are increased and device properties such as threshold voltage and mobility are improved through deposition of the second active layer 142.

FIGS. 7 to 10 are graphs showing test results on the third active layer 143 of the thin film transistor shown in FIG. 2.

FIGS. 7 to 10 show interfacial properties with respect to the third active layer 143 corresponding to the front channel depending on presence/absence of the gallium zinc oxide layer 143a and the zinc oxide layer 143b.

First, FIG. 7 shows interfacial properties in a case in which both the gallium zinc oxide layer 143a and the zinc oxide layer 143b are formed. In this case, interfacial properties of similar threshold voltage and mobility as in FIG. 3 can be seen.

Next, FIG. 8 shows interfacial properties in a case in which the gallium zinc oxide layer 143a is formed, whereas the zinc oxide layer 143b is not formed. In this case, as compared to FIG. 7, threshold voltage is slightly increased and is maintained at about 0V, and mobility is increased. In addition, on current and off current are converted, like interfacial properties shown in FIG. 7.

FIG. 9 shows interfacial properties in a case in which the gallium zinc oxide layer 143a is not formed, whereas only the zinc oxide layer 143b is formed. In this case, the threshold voltage is greatly decreased, but mobility is slightly increased, as compared to FIG. 8.

FIG. 10 shows interfacial properties in a case in which neither the gallium zinc oxide layer 143a nor the zinc oxide layer 143b is formed. This shows interfacial properties in the case in which the third active layer is absent, indicating that threshold voltage is slightly increased and mobility is slightly deteriorated, as compared to FIG. 9.

The following Table 2 compares values of on/off current, sub-threshold slope (S.S), threshold voltage (Vth), and mobility shown in FIGS. 7 to 10.

TABLE 2

|  | On current | Off current | s.s | Threshold voltage | Mobility |
| --- | --- | --- | --- | --- | --- |
| FIG. 7 | 7.96E−04 | 1.00E−10 | 0.35 | 0.81 | 48.38 |
| FIG. 8 | 8.78E−04 | 1.39E−10 | 0.34 | −0.06 | 55.02 |
| FIG. 9 | 1.10E−03 | 1.75E−10 | 0.36 | −1.84 | 58.54 |
| FIG. 10 | 8.44E−04 | 1.54E−10 | 0.35 | −0.47 | 51.13 |

Hereinbefore, interfacial properties have been evaluated depending on presence/absence of the gallium zinc oxide layer 143a and the zinc oxide layer 143b in the third active layer 143 and supply of the diethyl zinc 130. As a result, it can be seen that the lowest threshold voltage and the highest mobility can be obtained when both the gallium zinc oxide layer 143a and the zinc oxide layer 143b are formed and the diethyl zinc 130 is supplied.

In addition, as a result of evaluation of device properties depending on presence/absence of the gallium zinc oxide layer 143a and the zinc oxide layer 143b, in the case in which either the gallium zinc oxide layer 143a or the zinc oxide layer 143b is formed, current is slightly increased, but distribution of device transfer curve is deteriorated.

Accordingly, by depositing the gallium zinc oxide layer 143a and the zinc oxide layer 143b on the third active layer 143, advantageously, the distribution of cell transfer curve can be improved and devices having stable threshold voltage, current and mobility can be manufactured by improvement in interfacial properties.

In conclusion, the second active layer 142 and the third active layer 143 can be deposited in the form of a composite film structure, and interfacial properties between the gate insulator 120 and the active layer 140, or interfacial properties between the active layer 140 and the etch stop layer 150 can be improved and stable devices can thus be realized by controlling compositions of sources constituting respective layers and thickness of the layers to improve device properties such as threshold voltage and mobility.

The zinc oxide layers 142b and 143b are layers that contact the interface with GI or ESL and affect improvement in film qualities of the interface, and the gallium zinc oxide layers 142a and 143a increase resistances of the second active layer 142 and the third active layer 143 of the active layer 140, that is, resistances of the front channel and the back channel, thereby improving reducing leak current and improving device properties.

Hereinafter, a method for manufacturing a thin film transistor according to the present invention will be described with reference to the annexed drawings in detail.

FIGS. 11 and 12 are flowcharts illustrating a method for manufacturing the thin film transistor according to the present invention (S100). Hereinafter, the same reference numbers as described above are used to designate the same elements.

Referring to FIGS. 11 and 12, the method for manufacturing the thin film transistor according to the present invention (S100) includes: forming a gate insulator 120 (S110) including forming a gate electrode 110 on a substrate B and forming the gate insulator 120 on the gate electrode 110; forming an active layer (S130) including forming a third active layer on the gate insulator 120 (S133), forming a first active layer on the third active layer 143 (S131) and forming a second active layer on the first active layer 141 (S132); forming an etch stop layer over the entire surface of the substrate B including the first active layer 131 to the third active layer 133 (S140); and forming a source electrode S and a drain electrode D spaced apart from each other by a predetermined distance on the etch stop layer 150 such that the source electrode S and the drain electrode D are connected to the active layer 140 (S150).

First, with respect to the forming the gate insulator (S110), the gate electrode 110 is formed in a predetermined region on the substrate B. In addition, the gate insulator 120 is formed over the entire surface including the gate electrode 110.

To form the gate electrode 110, for example, a conductive layer is formed on the substrate B using CVD and the conductive layer is then patterned by photography and etching using a predetermined mask.

The conductive layer may be formed using any one of a metal, a metal alloy, metal oxide, a transparent conductive film and a compound thereof. In addition, the conductive layer may be formed with a plurality of layers in consideration of conductivity and resistance properties.

In addition, the gate insulator 120 may be formed over the entire surface including the gate electrode 110 using an inorganic insulating material or an organic insulating material including oxide or nitride.

In addition, the forming the active layer (S130) is carried out by sequentially forming the third active layer (S133), forming the first active layer (S131), and forming the second active layer (S132).

The forming the third active layer (S133) and the forming the second active layer (S132) include forming the zinc oxide layer and the gallium zinc oxide layer, as described above and the order thereof is as follows.

The forming the third active layer (S133) includes sequentially forming a first zinc oxide layer on the gate insulator 120 (S133a), and forming a first gallium zinc oxide layer on the first zinc oxide layer 143b (S133b).

In addition, the first active layer 141 is formed on the first gallium zinc oxide layer 143a. The forming the first active layer S131 includes sequentially forming a first oxide thin film layer on the first gallium zinc oxide layer 143a by atomic layer deposition (S131a), and forming a second oxide thin film layer on the first oxide thin film layer 141a by chemical vapor deposition (S131b).

Preferably, IGZO thin films are formed by atomic layer deposition and chemical vapor deposition, as described above. An oxidation source for the atomic layer deposition may be an oxygen-containing substance, preferably ozone $O_3$, and may be a plasma state of oxygen ($O_2$), $N_2O$, or $CO_2$.

In addition, an oxidation source for the chemical vapor deposition may be oxygen, ozone, a combination of water and oxygen, a combination of water and ozone, oxygen plasma, or the like, and is most preferably a combination of water and oxygen, or a combination of water and ozone.

Meanwhile, when the oxide thin film layers are formed as a multilayer structure by different deposition methods, composition ratios may be varied. Flow amount of at least one of source materials may be greater or smaller than that of one metal oxide thin film layer, or flow amount of the oxidation source may also be controlled. As a result, as compared to one metal oxide thin film layer, interfacial properties, for example, current, mobility and threshold voltage, of another metal oxide thin film layer can be improved.

In addition, the second active layer 142 is formed on the second oxide thin film layer 141b, and the forming the second active layer S132 sequentially includes forming a second gallium zinc oxide layer on the second oxide thin film layer 141b (S132a) and forming a second zinc oxide layer 142b on the second gallium zinc oxide layer 142a (S132b).

Although specific embodiments have been described for illustration of technical concept of the present invention, it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

INDUSTRIAL APPLICABILITY

According to the thin film transistor and method for manufacturing the same of the present invention, the active layer is formed with the first active layer to the third active layer, thereby improving interfacial properties. Thus, there is an industrial applicability.

The invention claimed is:

1. A thin film transistor comprising:
a gate electrode on a substrate;
a gate insulator over an entire surface of the substrate including the gate electrode;
a first active layer comprising an indium-gallium-zinc oxide (IGZO) thin film on the gate insulator;
a second active layer, having a first multi-layer structure, on the first active layer, wherein the second active layer comprises:
a first zinc oxide layer (ZnO) spaced apart from an upper surface of the first active layer, and
a first gallium zinc oxide (GZO) layer between the first active layer and the first zinc oxide layer;
a third active layer, having a second multi-layer structure, under the first active layer, wherein the third active layer comprises:
a second ZnO layer spaced apart from a lower surface of the first active layer, and
a second GZO layer between the first active layer and the first zinc oxide layer; and
a source electrode and a drain electrode spaced apart by a predetermined distance, wherein the gate insulator is in contact with only the second ZnO layer, and the source electrode and the drain electrode are connected to the first active layer, the second active layer, and the third active layer.

2. The thin film transistor according to claim 1, wherein the first active layer comprises:
a first oxide thin film layer formed by atomic layer deposition (ALD); and
a second oxide thin film layer formed by chemical vapor deposition (CVD).

3. The thin film transistor according to claim 2, wherein the first oxide thin film layer is closer to the gate insulator than the second oxide thin film layer.

4. The thin film transistor according to claim 1, further comprising an etch stop layer between an upper surface of the second active layer and a lower surface of the source electrode and the drain electrode.

5. The thin film transistor according to claim 1, wherein diethyl zinc is supplied to the gate insulator before the third active layer is formed.

6. A method for manufacturing a thin film transistor comprising:
forming a gate electrode on a substrate and forming a gate insulator on the gate electrode;
forming a third active layer, having a first multi-layer structure, on the gate insulator, the third active layer comprising a first zinc oxide (ZnO) on the gate insulator and a first gallium zinc oxide (GZO) layer on the first ZnO layer, wherein the gate insulator is in contact with only the first ZnO layer;
forming a first active layer comprising an indium-Gallium-zinc oxide (IGZO) thin film on the third active layer;
forming a second active layer, having a second multi-layer structure, on the first active layer, the second active layer including a second GZO layer on the first active layer and a second ZnO layer on the second GZO layer;
forming an etch stop layer over an entire surface of the substrate including the first active layer to the third active layer; and
forming a source electrode and a drain electrode spaced apart from each other by a predetermined distance on the etch stop layer such that the source electrode and the drain electrode are connected to the first active layer, the second active layer, and the third active layer.

7. The method according to claim 6, wherein forming the first active layer comprises:
forming a first oxide thin film layer on the first gallium zinc oxide layer by atomic layer deposition; and
forming a second oxide thin film layer on the first oxide thin film layer by chemical vapor deposition.

8. The thin film transistor according to claim 2, wherein each of the first oxide thin film layer and the second oxide thin film layer comprises IGZO.

9. The method according to claim 7, wherein each of the first oxide thin film layer and the second oxide thin film layer comprises IGZO.

10. The method according to claim 6, further comprising supplying diethyl zinc to the gate insulator before forming the third active layer.

* * * * *